United States Patent
Sumi et al.

(10) Patent No.: US 7,254,079 B2
(45) Date of Patent: Aug. 7, 2007

(54) ELECTRICAL FUSE CIRCUIT

(75) Inventors: Shinichi Sumi, Kobe (JP); Yasuhiro Agata, Osaka (JP); Masanori Shirahama, Otsu (JP); Toshiaki Kawasaki, Takatsuki (JP); Ryuji Nishihara, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/324,243

(22) Filed: Jan. 4, 2006

(65) Prior Publication Data

US 2006/0158920 A1 Jul. 20, 2006

(30) Foreign Application Priority Data

Jan. 14, 2005 (JP) .............................. 2005-006960

(51) Int. Cl.
*G11C 17/18* (2006.01)
*G11C 7/00* (2006.01)
(52) U.S. Cl. .............................. 365/225.7; 365/189.12; 365/221
(58) Field of Classification Search ............. 365/225.7, 365/189.12, 221
See application file for complete search history.

(56) References Cited

U.S. PATENT DOCUMENTS

| | | | | |
|---|---|---|---|---|
| 6,292,422 B1 * | 9/2001 | Pitts | ......................... | 365/225.7 |
| 6,798,272 B2 * | 9/2004 | Lehmann | ..................... | 327/525 |
| 7,031,218 B2 * | 4/2006 | Hoffmann et al. | ........ | 365/225.7 |

FOREIGN PATENT DOCUMENTS

WO    WO 97/12401    4/1997

* cited by examiner

*Primary Examiner*—Son Dinh
(74) *Attorney, Agent, or Firm*—Steptoe & Johnson LLP (57) ABSTRACT

An electrical fuse circuit of the present invention includes a plurality of electrical fuse cores (1) each of which has an electrical fuse element (3) and a switch transistor (4) connected in series with each other, and shift registers (2) connected to the plurality of electrical fuse cores (1) to program the electrical fuse elements (3). Program enable signals (Si) are sequentially generated and transferred by the shift registers (2), the switch transistors (4) are sequentially brought into conduct according to the program enable signals (Si) and the information of program data (Di), and the electrical fuse elements (3) are blown one by one.

8 Claims, 9 Drawing Sheets

PRIOR ART

ELECTRICAL FUSE CIRCUIT

FIELD OF THE INVENTION

The present invention relates to an electrical fuse circuit in which programming is performed by passing current through an electrical fuse element and blowing the electrical fuse element.

BACKGROUND OF THE INVENTION

Conventionally, electrical fuse devices (electrical fuse circuits) are configured using electrical fuse elements made of polysilicon or the like and are widely used for semiconductor integrated circuits (LSI) of trimming program devices of high-frequency semiconductor devices. In semiconductor integrated circuits including such electrical fuse devices, electrical fuse elements are blown by applying a large current of about 1 A with bipolar transistors, so that programming is performed.

In recent years, for semiconductor integrated circuits, a process has been developed in which a metallic material is formed as a gate material on polysilicon by silicification and the resistance of the gate material is reduced. Accordingly, a technique for electrical fuse elements has become available. The technique uses a mechanism for cutting a silicide layer on a top surface and increasing a resistance by passing current through a gate material. In the case of 130-nm and 90-nm process generations, when electrical fuse elements are fed with current and blown, blowing requires an instantaneous carrying current of 10 to 30 mA for each electrical fuse element.

When such an electrical fuse device is used for a trimming device or the like of a high-frequency device, the number of mounted electrical fuse elements is not more than four to eight for one chip of a system LSI. Thus, the electrical fuse elements can be blown at a time using a tester.

The following will describe such a conventional electrical fuse device (for example, National Publication of International Patent Application No. 11-512879, page 31, FIG. 3) used for a semiconductor integrated circuit.

Figure 9:
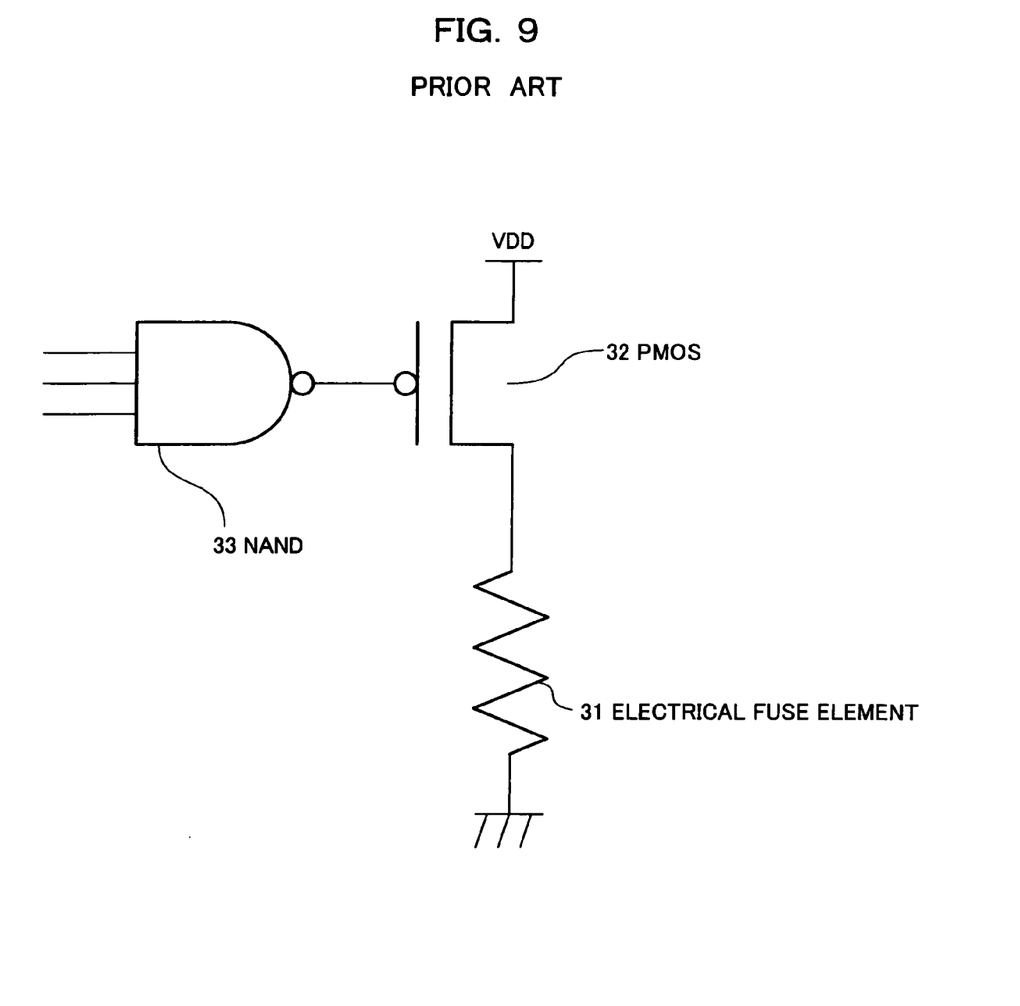
FIG. 9 is a circuit diagram showing the configuration of a conventional electrical fuse device.

FIG. 9 is a circuit diagram showing a structural example of an electrical fuse device conventionally used for a semiconductor integrated circuit. In FIG. 9, reference numeral 31 denotes an electrical fuse element, reference numeral 32 denotes a PMOS transistor connected in series with the electrical fuse element 31, and reference numeral 33 denotes an NAND circuit having its output connected to the gate of the PMOS transistor.

The blowing operation of the electrical fuse device will be discussed below.

A program signal is inputted to the NAND circuit 33. When the PMOS 32 is turned on by the program signal, current is passed through the electrical fuse element 31 which has been program selected. The electrical fuse element 31 is formed of a fine pattern of silicide, polysilicon, or metal. The electrical fuse element 31 is heated and blown by a predetermined current and thus has a break and a higher resistance. The initial resistance of the electrical fuse element having not been programmed is read and a resistance of the electrical fuse element having been programmed with a high resistance is read, so that a signal state 0/1 can be recognized. The electrical fuse device can be obtained thus.

In recent years, as system LSIs have become larger in size, the number of installed memories increases. The more memories are installed, the number of defective memory cells increases. Further, the number of defective memory cells has been further increased by finer design rules. In order to repair defective memories, metal fuses are conventionally used for redundancy repair of RAM such as DRAM and SRAM.

However, electrical fuse elements for cutting silicide on poly have recently become available. Since such electrical fuse elements can be blown with a small current, elements surrounding the fuse elements are less affected and damaged and the circuit configuration of an electrical fuse device can be equal to or smaller than that of a metal fuse. Thus, such an electrical fuse device can be used for RAM redundancy as well as a trimming device of a high-frequency device and are growing in demand.

The number of electrical fuse elements mounted for RAM redundancy repair in a system LSI is 500 to 1000 for one chip. In the case of 130 nm and 90 nm process generations, when electrical fuse elements are brought into conduction and blown, blowing requires an instantaneous carrying current of 10 to 30 mA for each electrical fuse element. Hence, when such an electrical fuse device is used for RAM redundancy repair, programming for 1000 electrical fuse elements at a time requires an instantaneous carrying current of about 10 A.

However, it is difficult for an existing general-purpose tester to supply a current of 10 A according to the program and supply a current of 10 A concentratedly to an electrical fuse device in an LSI chip, so that a special tester is necessary.

Even in the case where 1000 electrical fuse circuit blocks are separately provided as an electrical fuse device and electrical fuse elements are blown one by one, a number of control terminals are necessary (one electrical fuse circuit block with four control terminals requires 4000 control terminals). Thus, such an electrical fuse device cannot be mounted in a system LSI. For this reason, such an electrical fuse device cannot be mounted for RAM redundancy repair in a system LSI.

DISCLOSURE OF THE INVENTION

The present invention is devised to solve the conventional problems. An object of the present invention is to provide an electrical fuse circuit whereby, for example, even when a number of electrical fuse elements are necessary for RAM redundancy repair, the electrical fuse elements can be easily mounted in an LSI and programming can be easily performed by blowing the electrical fuse elements with an existing general-purpose tester.

In order to solve the problems, the first invention comprises a plurality of fuse cores each having a fuse element and a switch transistor connected in series with the fuse element, and shift registers connected to the plurality of fuse cores to program the fuse elements, wherein the shift registers sequentially transfer program enable signals enabling programming, and the plurality of fuse cores sequentially bring the switch transistors into conduction and program the fuse elements according to the program enable signals from the shift registers and data information for the programming.

With this configuration, the fuse elements can be blown one by one or blowing can be performed simultaneously on the fuse elements equivalent to an instantaneous carrying current equal to or lower than the current supply capacity of a tester, and the plurality of fuse cores are sequentially connected to the serially connected shift registers of two or more stages. Thus, it is possible to achieve a configuration with a small number of terminals.

The second invention comprises a plurality of fuse cores each having a fuse element and a switch transistor connected in series with the fuse element, and shift registers connected to the plurality of fuse cores to program the fuse elements, wherein the shift register of the first stage has its input fixed at H or L, and each of the shift registers comprises a DFF circuit operating in synchronization with a program clock signal and a unit for generating a program enable signal to enable programming in response to a change of an internal signal of the DFF circuit, the change occurring in a process where the DFF circuits sequentially transmit the input of the first stage in synchronization with the program clock signals, and the plurality of fuse cores sequentially bring the switch transistors into conduction to program the fuse elements according to the program enable signals from the shift registers and data information for the programming.

With this configuration, it is not necessary to control an input signal to the shift register of the first stage, thereby further reducing the number of terminals.

The third invention is the electrical fuse circuit of the first invention or the second invention, wherein the shift registers sequentially input the program enable signals to the plurality of fuse cores in the process of transferring the generated program enable signals, and each of the plurality of fuse cores brings the switch transistor into conduction at a time in response to the input of the program enable signal.

With this configuration, the fuse elements can be blown one by one using an existing general-purpose tester. Moreover, the plurality of fuse cores are sequentially connected to the serially connected shift registers of two or more stages, thereby achieving a configuration with a small number of terminals.

The fourth invention is the electrical fuse circuit of the first invention or the second invention, wherein the plurality of fuse cores are each divided into a plurality of blocks and an input of the program enable signal is shared by each of the blocks, the shift registers sequentially input the program enable signals to the plurality of blocks in a process of transferring the generated program enable signals, and the plurality of fuse cores bring the switch transistors into conduction at a time in response to the input of the program enable signal to each of the blocks.

As described above, blowing is performed simultaneously on the fuse elements equivalent to an instantaneous carrying current equal to or lower than the current supply capacity of a tester. Thus, it is possible to shorten time for programming the fuse elements as compared with fuse elements blown one by one. Additionally, it is possible to further reduce the number of stages of the shift registers for one fuse core, thereby reducing the number of circuits. Moreover, the plurality of fuse cores are sequentially connected to the serially connected shift registers of two or more stages, thereby achieving a configuration with a small number of terminals.

As described above, according to the present invention, the fuse elements can be blown one by one or blowing can be performed simultaneously on the fuse elements equivalent to an instantaneous carrying current equal to or lower than the current supply capacity of a tester. Moreover, the plurality of fuse cores are sequentially connected to the serially connected shift registers of two or more stages, thereby achieving a configuration with a small number of terminals.

Further, the initial input signal of the shift register of the first stage is fixed at H/L, and the shift register generates a one-shot pulse using the DFF circuit and a master/slave signal. Thus, it is not necessary to control an input signal to the shift register of the first stage, thereby further reducing the number of terminals.

Moreover, the fuse elements can be blown one by one using an existing general-purpose tester. Moreover, the plurality of fuse cores are sequentially connected to the serially connected shift registers of two or more stages, thereby achieving a configuration with a small number of terminals.

Further, blowing is performed simultaneously on the fuse elements equivalent to an instantaneous carrying current equal to or lower than the current supply capacity of a tester, thereby shortening time for programming the fuse elements as compared with fuse elements blown one by one. Additionally, it is possible to further reduce the number of stages of the shift registers for one fuse core, thereby reducing the number of circuits. Moreover, the plurality of fuse cores are sequentially connected to the serially connected shift registers of two or more stages, thereby achieving a configuration with a small number of terminals.

Consequently, for example, even when a number of electrical fuse elements are necessary for RAM redundancy repair and so on, the electrical fuse elements can be easily mounted in an LSI and a number of electrical fuse elements can be easily blown and programmed using an existing general-purpose tester.

DESCRIPTION OF THE EMBODIMENTS

Electrical fuse circuits according to embodiments of the present invention will be specifically described below with reference to the accompanying drawings.

Embodiment 1

The following will discuss an electrical fuse circuit according to Embodiment 1 of the present invention.

Figure 1:
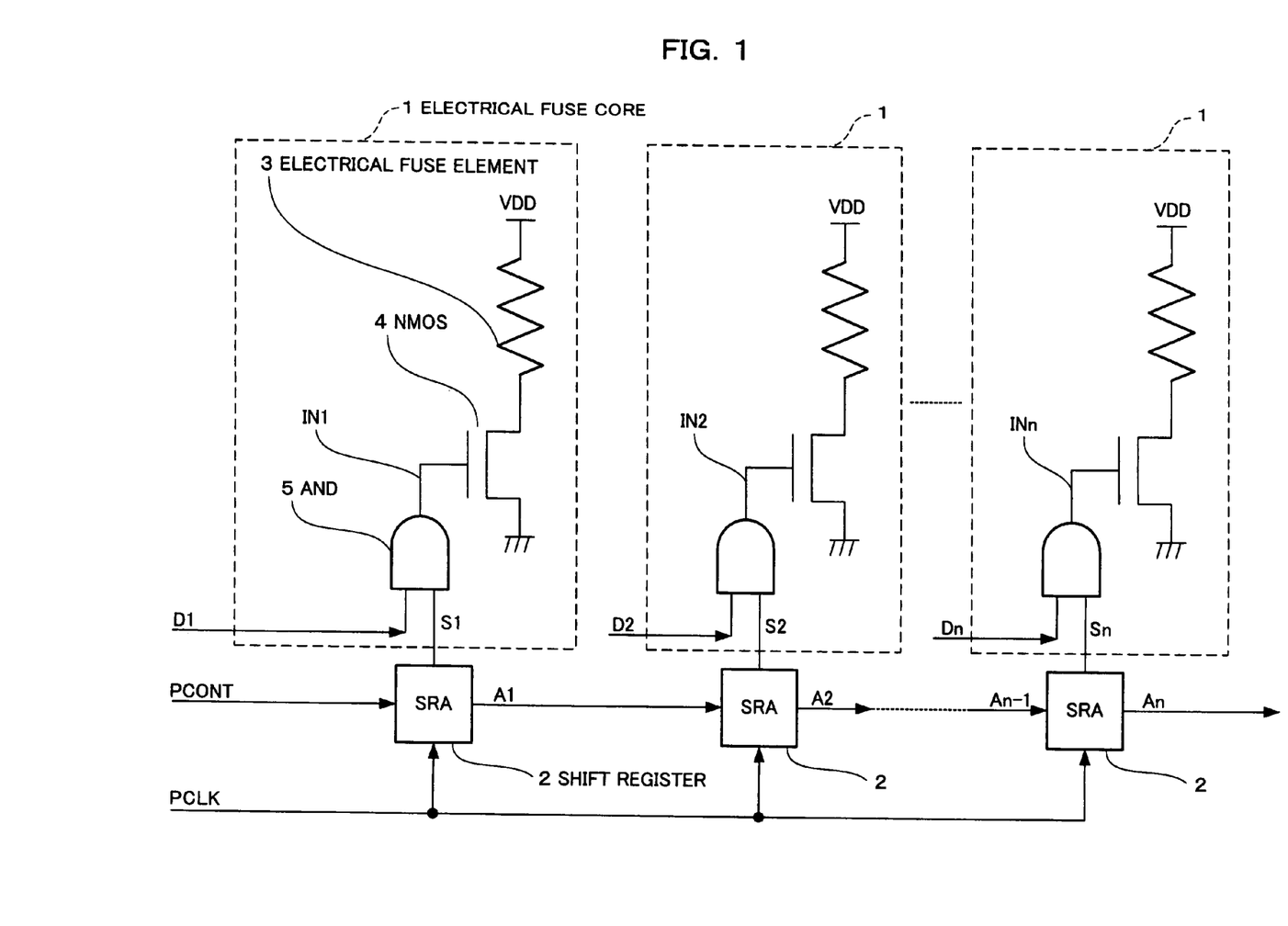
FIG. 1 is a circuit diagram showing the configuration of an electrical fuse circuit according to Embodiment 1 of the present invention.

FIG. 1 is a circuit diagram showing the configuration of the electrical fuse circuit of Embodiment 1, in which two or more (n) fuse elements are configured as one module. In the electrical fuse circuit of FIG. 1, reference numeral 1 denotes n electrical fuse cores and reference numeral 2 denotes shift registers of n stages.

In the electrical fuse core 1, reference numeral 3 denotes an electrical fuse element having one end connected to a power supply (VDD), reference numeral 4 denotes an NMOS transistor which is connected in series with the electrical fuse element 3 and has its source connected to a ground terminal, and reference numeral 5 denotes a two-input AND circuit which has as its input a program data signal Di (i=1 to n) and a program enable signal Si (i=1 to n) from the shift register 2 and outputs a program signal INi (i=1 ton) to the gate of the NMOS transistor 4.

The shift registers 2 are serially connected in such a way that a program control signal PCONT is inputted to the first stage and the output of the previous stage is connected to the input of the subsequent stage from the first stage to the n-th stage (program enable transmission signals A1 to An). A program clock signal PCLK is connected in common from the first stage to the n-th stage of the shift registers 2. Further, the program enable signals S1 to Sn outputted from the shift registers 2 are connected respectively as the program enable signals of the electrical fuse cores from the first stage to the n-th stage.

Figure 2:
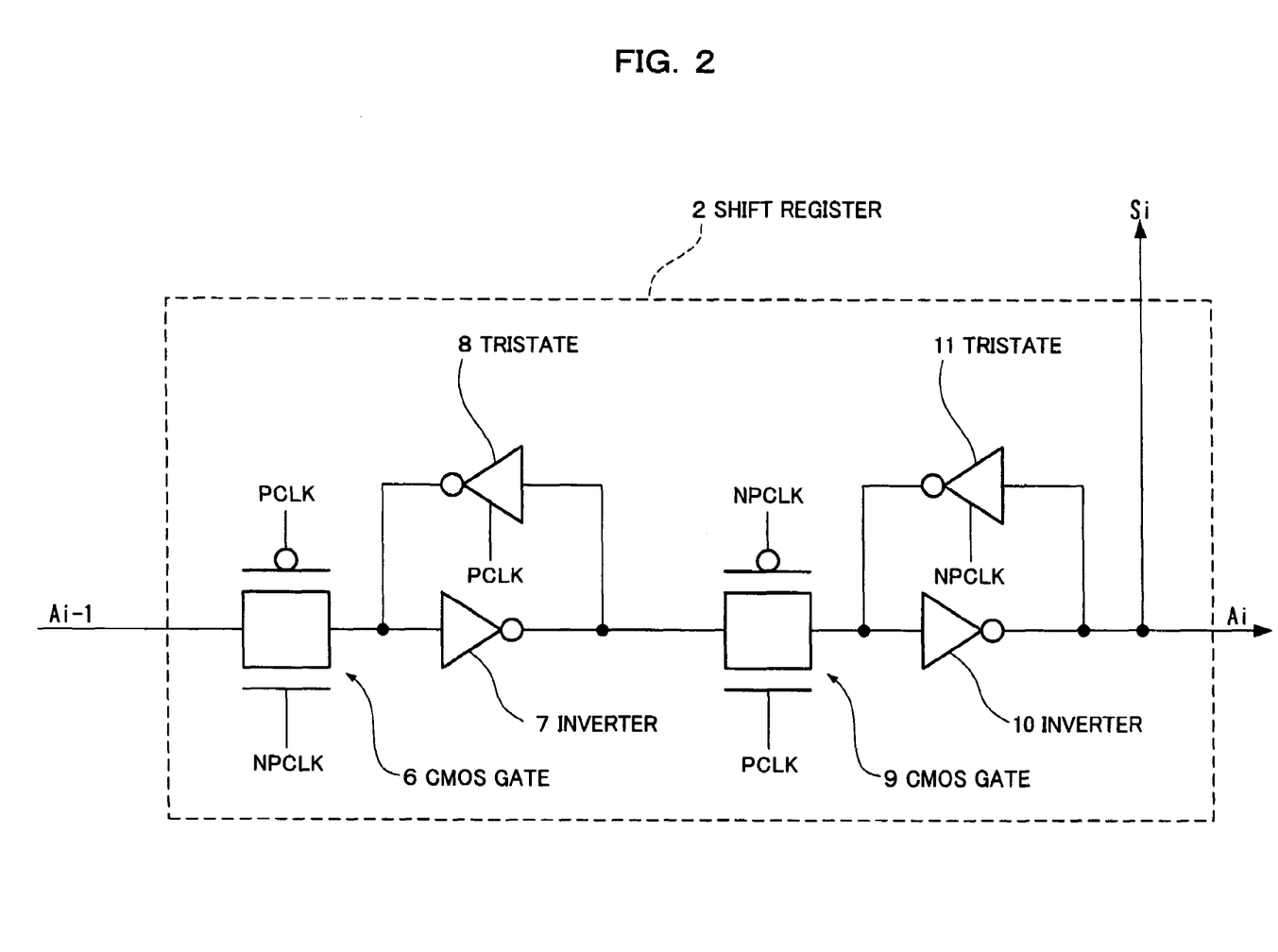
FIG. 2 is a circuit diagram showing the configuration of a shift register in the electrical fuse circuit of Embodiment 1.

Referring to FIG. 2, the following will discuss a specific circuit configuration of the shift register 2 shown in FIG. 1.

FIG. 2 is a circuit diagram showing the configuration of the i-th stage of the shift register 2 shown in FIG. 1. In the shift register 2 of FIG. 2, reference numeral 6 denotes a CMOS gate circuit in which the gate of a PMOS transistor is connected to the program clock signal PCLK, the gate of an NMOS transistor is connected to an inverted signal NPCLK of the program clock signal PCLK, and the input of the CMOS gate circuit 6 is connected to the program enable transmission signal Ai-1 serving as the output of the (i−1)th stage, reference numeral 7 denotes an inverter which has as its input the output of the CMOS gate circuit 6, reference numeral 8 denotes a tristate inverter circuit which has as its input the output of the inverter 7, has PCLK as a control signal (enabled at High), and has its output connected to the node of the output of the CMOS gate circuit 6 and the input of the inverter 7, reference numeral 9 denotes a CMOS gate circuit in which the gate of a PMOS transistor is connected to the inverted signal NPCLK of the program clock signal PCLK, the gate of an NMOS transistor is connected to the program clock signal PCLK, and the input of the CMOS gate circuit 9 is connected to the output of the inverter 7, reference numeral 10 denotes an inverter circuit which has as its input the output of the CMOS gate circuit 9 and outputs the program enable transmission signal Ai and the program enable signal Si, and reference numeral 11 denotes a tristate inverter circuit which has as its input the output of the inverter 10, has NPCLK as a control signal (enabled at High), and has its output connected to the node of the output of the CMOS gate circuit 9 and the input of the inverter 10.

Figure 3:
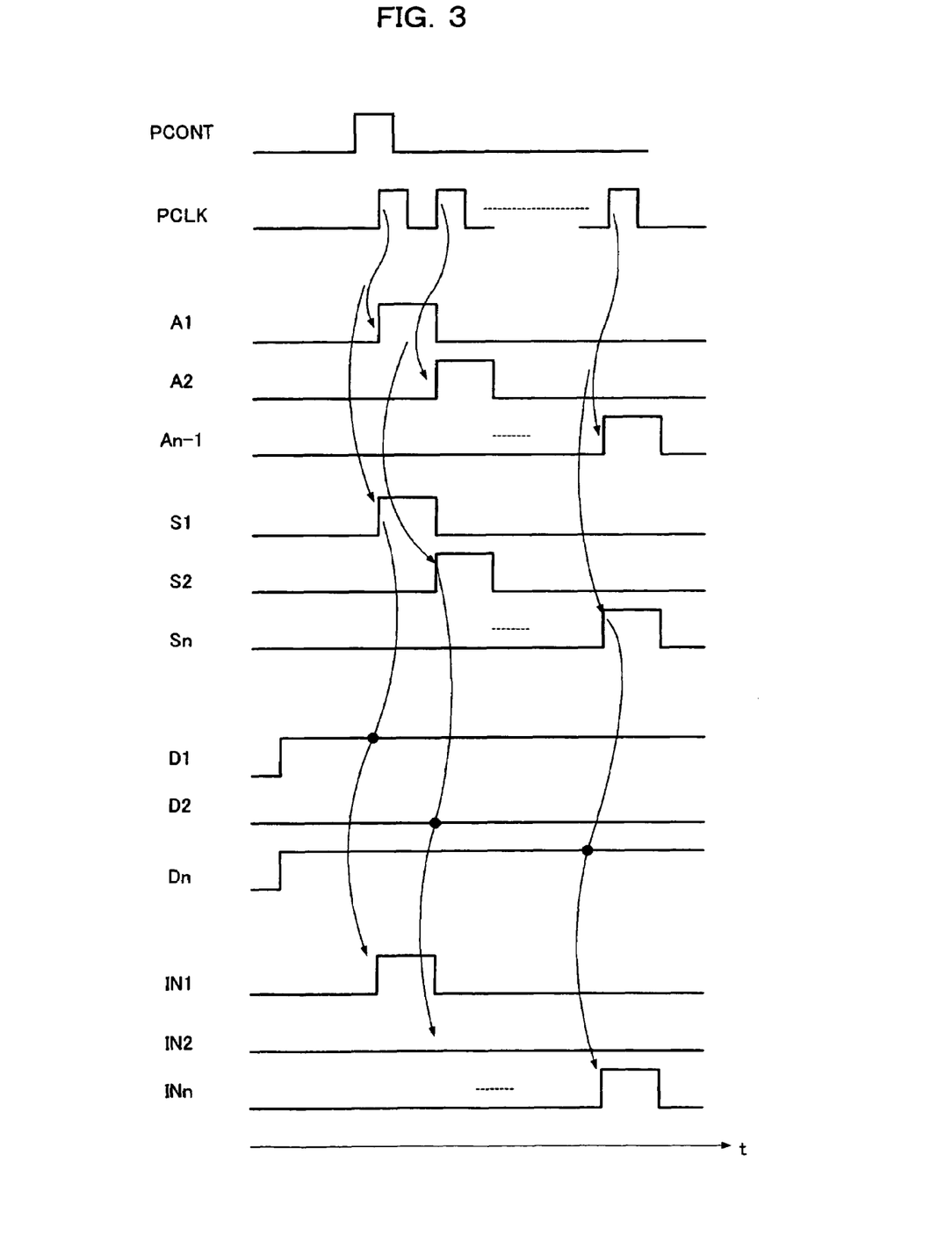
FIG. 3 is a waveform chart showing the operations of the electrical fuse circuit of Embodiment 1.

Referring to FIG. 3, the following will discuss the operations of the electrical fuse circuit configured thus.

FIG. 3 is a waveform chart showing the operations of the electrical fuse circuit according to Embodiment 1.

First, the operations in the i-th stage of the electrical fuse cores 1 will be described below.

When the electrical fuse element 3 is programmed (blown out), program data Di corresponding to an electrical fuse element to be programmed is set at High (H), program data Di corresponding to an electrical fuse element not to be programmed is set at Low (L), and the program data is inputted to one of the input terminals of the two-input AND circuit 5. For actual programming at some point of time, the program enable signal Si is inputted as a pulse signal to one of the input terminals of the two-input AND circuit 5.

Programming is enabled only in a time period during which the program enable signal Si is set at H. When the program data Di is set at H, the output INi of the two-input AND circuit 5 is set at H, the NMOS transistor 4 is turned on, and current passes through the electrical fuse element 3, so that the electrical fuse element 3 is blown out. Meanwhile, in the case where the program data Di is set at L, even when the program enable signal Si is set at H, the output INi of the two-input AND circuit 5 is set at L, the NMOS transistor 4 is turned off, and current does not pass through the electrical fuse element 3, so that the electrical fuse element 3 is not blown out.

The following will discuss the operations of the overall electrical fuse circuit.

For example, first, when 1 to n programs (1, 0, . . . , 1) are prepared for the n electrical fuse cores 1, (D1, D2, . . . , Dn) =(1, 0, . . . , 1) is inputted.

Then, the initial program enable signal PCONT is raised from L to H in the first stage of the shift register 2 while setup is sufficiently kept for the rising edge of the program clock signal PCLK. In the shift register of the first stage, the CMOS gate circuit 6 (see the circuit diagram of FIG. 2) is turned on and H of the signal PCONT is inputted while the signal PCLK is set at L. When the signal PCLK rises from L to H, the CMOS gate circuit 6 is turned off and latched by the inverter 7 and the tristate inverter circuit 8, and L is outputted to the output of the inverter 7. Since the CMOS gate circuit 9 is turned on, H is outputted to the program enable signal S1 and the program enable transmission signal A1. The signal PCONT brought down to L while the signal PCLK is set at H.

Then, when the signal PCLK falls from H to L, the CMOS gate circuit 6 is turned on again and L of the signal PCONT is inputted. The CMOS gate circuit 9 is turned off and latched by the inverter 10 and the tristate inverter circuit 11. The program enable signal S1 and the program enable transmission signal A1 are kept at H. While the signal PCLK is set at L, the program enable transmission signal A1=H is inputted to the input of the shift register of the second stage.

As described above, every time the periodic clocking operation of the program clock signal PCLK is repeated, the program enable signals Si (i=1 ton) are sequentially generated as pulse signals each having a width of one period of the signal PCLK, and the program enable transmission signals Ai (i=1 to n) are similarly transmitted in a sequential manner to the shift registers of the subsequent stages.

When the pulse signal of the program enable signal Si is inputted to the two-input AND circuit 5 of the electrical fuse core 1, a programmable state is generated as described above. Thus, based on program data (D1, D2, . . . , Dn)=(1, 0, . . . , 1), the state of the output INi (i=1 to n) of the two-input AND circuit 5 is determined according to the rising edge of the signal PCLK. In FIG. 3, IN1 is set at H, the NMOS transistor 4 is turned on only in a time period equivalent to the pulse width of IN1, and the first electrical fuse element 3 is blown. IN2 is set at L, the NMOS transistor 4 is turned off, and the second electrical fuse element 3 is not blown. INn is set in a similar manner to IN1 and the n-th electrical fuse element 3 is blown.

As described above, the electrical fuse elements 3 are blown one by one using the pulse signal of the program enable signal Si which is transferred using the shift register 2, so that the electrical fuse elements 3 can be blown using an existing general-purpose tester. Moreover, the shift registers 2 are connected in a serial manner, thereby achieving an excellent electrical fuse circuit which can be configured with a small number of terminals and mounted on a system LSI.

Embodiment 2

The following will discuss an electrical fuse circuit according to Embodiment 2 of the present invention.

Figure 4:
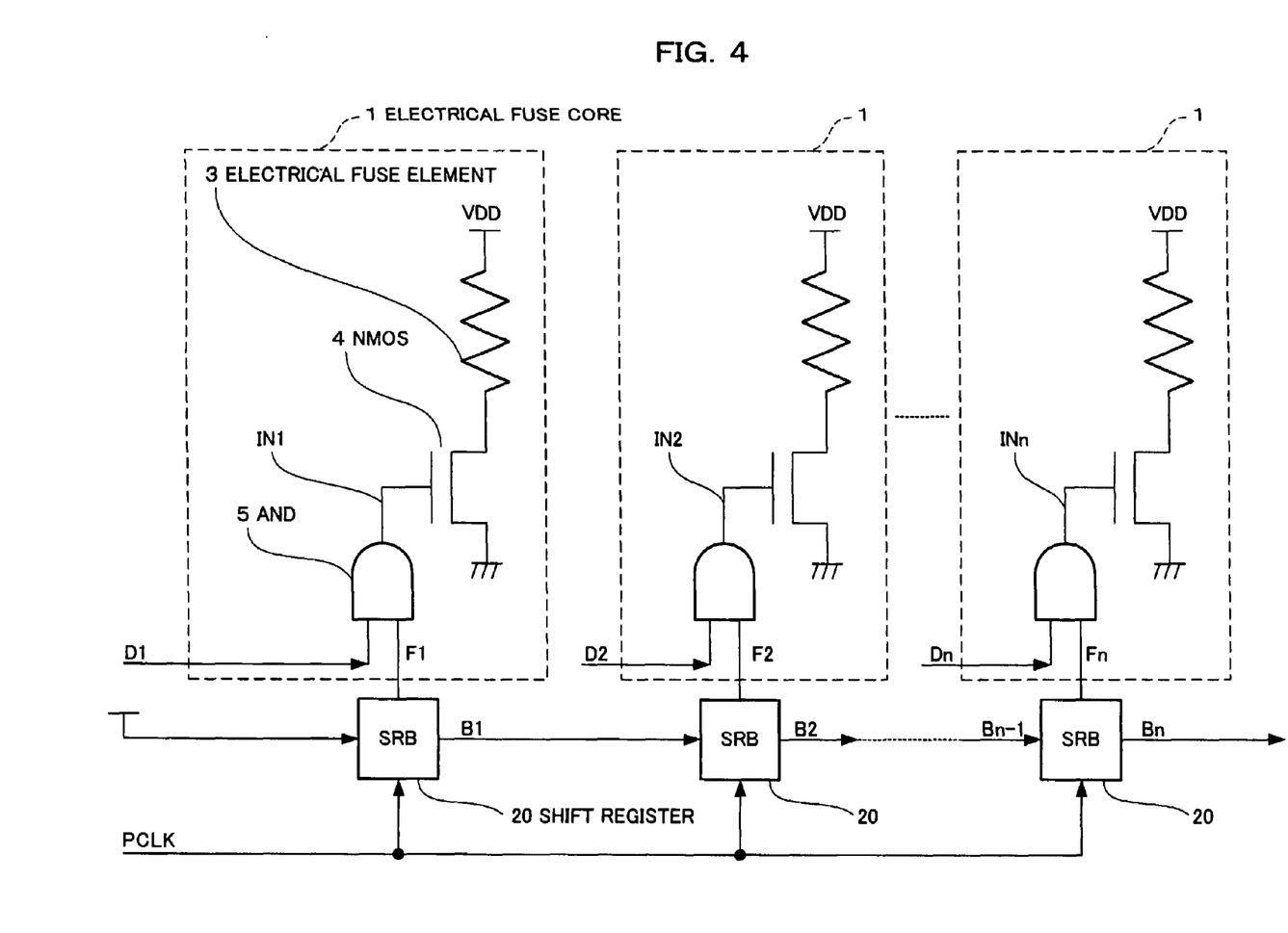
FIG. 4 is a circuit diagram showing the configuration of an electrical fuse circuit according to Embodiment 2 of the present invention.

FIG. 4 is a circuit diagram showing the configuration of the electrical fuse circuit of Embodiment 2, in which two or more (n) electrical fuse elements are configured as one module. The same constituent elements as FIG. 1 are indicated by the same reference numerals.

In FIG. 4, reference numeral 20 denotes shift registers of n stages. Unlike FIG. 1, the input of the shift register 20 of the first stage is fixed at a power supply (H level). The shift registers 20 are serially connected from the first stage to the n-th stage in such a way that the output of the previous stage is connected to the input of the subsequent stage. Program enable transmission signals B1 to Bn are outputted from the respective stages. A program clock signal PCLK is connected in common from the first stage to the n-th stage of the shift registers 20. Further, program enable signals F1 to Fn outputted from the shift registers 20 are connected respectively as the program enable signals of electrical fuse cores 1 from the first stage to the n-th stage.

Figure 5:
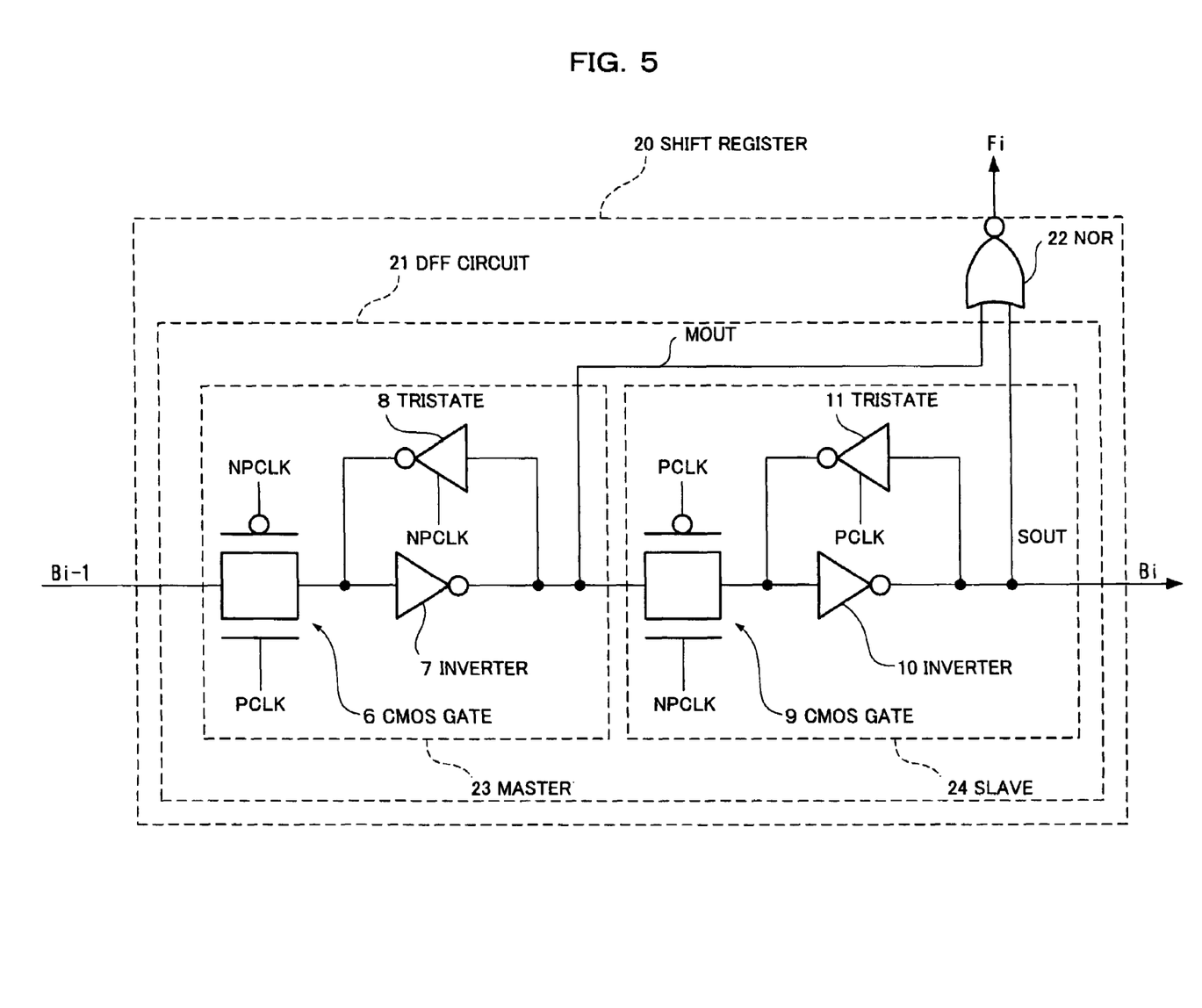
FIG. 5 is a circuit diagram showing the configuration of a shift register in the electrical fuse circuit of Embodiment 2.

Referring to FIG. 5, the following will discuss a specific circuit configuration of the shift register 20 shown in FIG. 4.

FIG. 5 is a circuit diagram showing the configuration of the i-th stage of the shift register 20 shown in FIG. 4. In FIG. 5, the same constituent elements as FIG. 2 are indicated by the same reference numerals. In the shift register 20 of FIG. 5, reference numeral 21 denotes a DFF circuit and reference numeral 22 denotes a two-input NOR circuit. The DFF circuit 21 has as its input the program enable transmission signal Bi-1, which is the output of the (i−1)th stage, supplies internal signals MOUT and SOUT to the input of the two-input NOR circuit 22, and outputs the program enable transmission signal Bi. The two-input NOR circuit 22 has as its input the internal signals MOUT and SOUT of the DFF circuit 21 and outputs the program enable signal Fi.

In the DFF circuit 21, reference numeral 23 denotes a master which is fed with the signal Bi-1 in synchronization with the program clock signal PCLK and outputs a signal MOUT, and reference numeral 24 denotes a slave which is fed with the output signal MOUT of the master 23 in synchronization with the signal PCLK with a half period delay and outputs a signal SOUT (=Bi).

In the master 23, a CMOS gate circuit 6, an inverter 7, and a tristate inverter circuit 8 are identical in configuration to those of FIG. 2. FIG. 5 is different from FIG. 2 in that an input signal from the CMOS gate circuit 6 to the gate of an NMOS transistor is PCLK, an input signal to the gate of a PMOS transistor is NPCLK, and the enable signal of the tristate inverter circuit 8 is NPCLK.

Similarly in the slave 24, a CMOS gate circuit 9, an inverter 10, and a tristate inverter circuit 11 are identical in configuration to those of FIG. 2. FIG. 5 is different from FIG. 2 in that an input signal from the CMOS gate circuit 9 to the gate of an NMOS transistor is NPCLK, an input signal to the gate of a PMOS transistor is PCLK, and the enable signal of the tristate inverter circuit 11 is PCLK.

Figure 6:
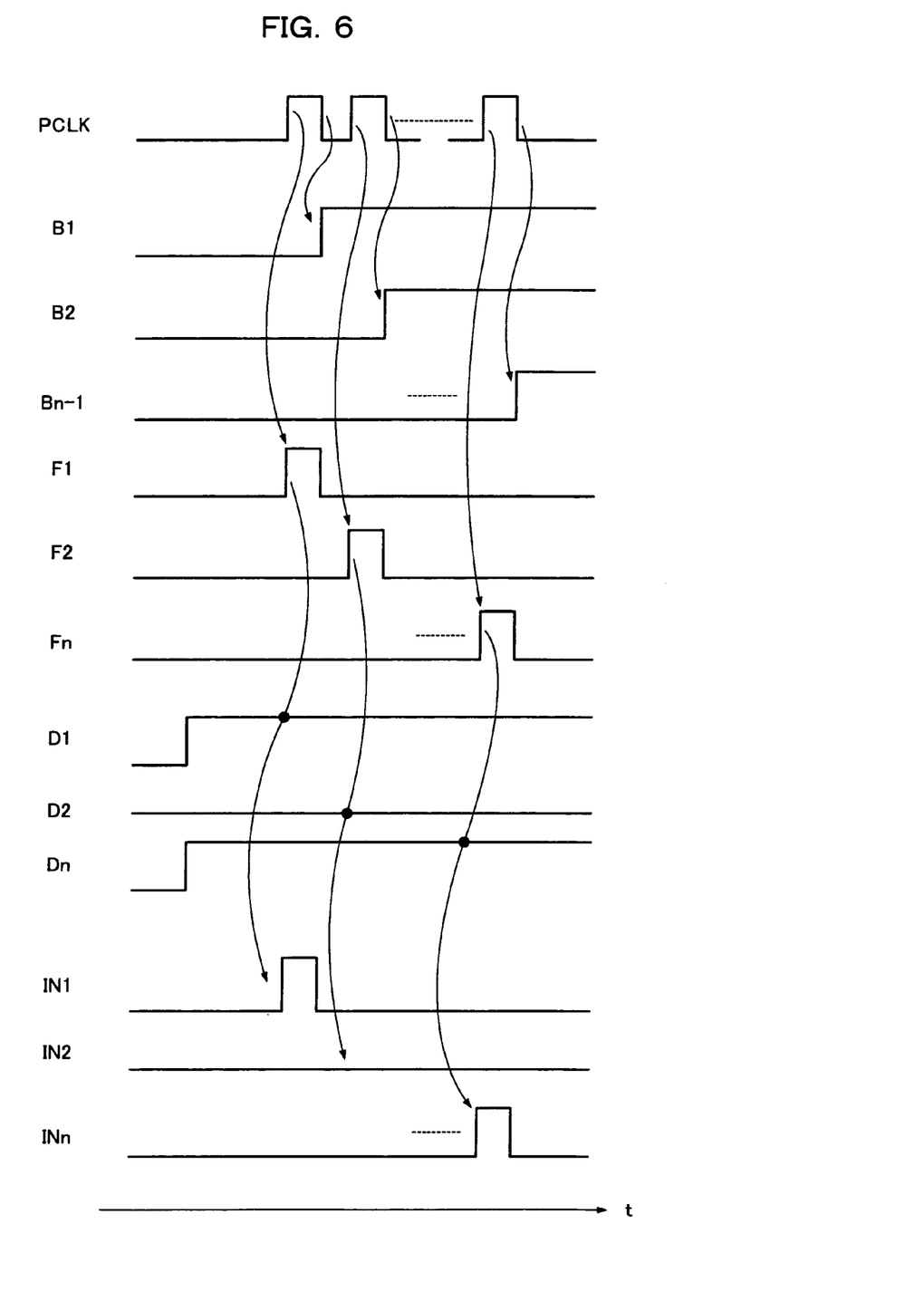
FIG. 6 is a waveform chart showing the operations of the electrical fuse circuit of Embodiment 2.

Referring to FIG. 6, the following will discuss the operations of the electrical fuse circuit configured thus.

First, as in Embodiment 1, when 1 to n programs (1, 0, . . . , 1) are prepared for the n electrical fuse cores 1, (D1, D2, . . . , Dn)=(1, 0, . . . , 1) is inputted.

It is assumed that in the shift register 20, the output signal MOUT of the master 23 in the DFF circuit 21 is set at H and the initial value of the output signal SOUT of the slave 24 is set at L. To the shift register 20 of the first stage, a signal fixed at the power supply (H level) is inputted instead of the program control signal PCONT of Embodiment 1. While PCLK is set at L, the CMOS gate circuit 6 (see the circuit diagram of FIG. 5) is turned off and the signal fixed at H is not inputted to the shift register of the first stage. Since the signals MOUT and SOUT (=B1) are kept in the initial state, the program enable signal, which is the output of the NOR circuit 22, is set at L.

Then, when the signal PCLK rises from L to H, the CMOS gate circuit 6 is turned on and H is inputted to the shift register of the first stage. At this point, the signal MOUT changes from H to L. The CMOS gate circuit 9 is turned off and latched by the inverter 10 and the tristate inverter circuit 11. The signal SOUT (=B1) is kept in the initial state L. Thus, the program enable signal, which is the output of the NOR circuit 22, changes from L to H in response to the transition of the signal MOUT from H to L and the signal SOUT kept at L.

Then, when the signal PCLK falls from H to L, the CMOS gate circuit 6 is turned off and the output signal MOUT of the master 23 is latched by the inverter 7 and the tristate inverter circuit 8 and kept at L. Since the CMOS gate circuit 9 is turned on, the signal SOUT (=B1) changes from L to H.

Thus, the program enable signal, which is the output of the NOR circuit 22, changes from H to L in response to the signal MOUT kept at L and the transition of the signal SOUT from L to H. While the signal PCLK is set at L, the program enable transmission signal B1=H is inputted to the input of the shift register of the second stage.

As described above, every time the periodic clocking operation of the program clock signal PCLK is repeated, the program enable signals Fi (i=1 to n) are sequentially generated as pulse signals each having a width of a half period of the signal PCLK, and the program enable transmission signals Bi (i=1 to n) are similarly transmitted in a sequential manner to the shift registers of the subsequent stages. Since the first stage of the shift register 20 is fixed at H, the signal Bi is kept in the same state after being changed from L to H once.

When the pulse signal of the program enable signal Fi is inputted to the two-input AND circuit 5 of the electrical fuse core 1, a programmable state is generated as described in Embodiment 1. Thus, the states of the output INi (i=1 to n) of the two-input AND circuit 5 are sequentially determined based on program data (D1, D2, . . . , Dn)=(1, 0, . . . , 1). In FIG. 6, IN1 is set at H, the NMOS transistor 4 is turned on only in a time period equivalent to the pulse width of IN1, and the first electrical fuse element 3 is blown. IN2 is set at L, the NMOS transistor 4 is turned off, and the second electrical fuse element 3 is not blown. INn is set in a similar manner to IN1 and the n-th electrical fuse element 3 is blown.

As described above, the input of the shift register of the first stage is fixed at H, the output of the master 23 and the output of the slave 24 are inputted to the two-input NOR circuit 22, the DFF circuit 21 operates in synchronization with the program clock signal PCLK, and the input of the shift register of the first stage is transmitted in a sequential manner. In this process, a one-shot pulse waveform outputted from the two-input NOR circuit 22 is used as a program enable signal, so that it is possible to achieve an excellent electrical fuse circuit which can eliminate the need for controlling the input signal to the shift register circuit of the first stage, reduce the number of terminals, and facilitate tests.

Embodiment 3

The following will discuss an electrical fuse circuit according to Embodiment 3 of the present invention.

Figure 7:
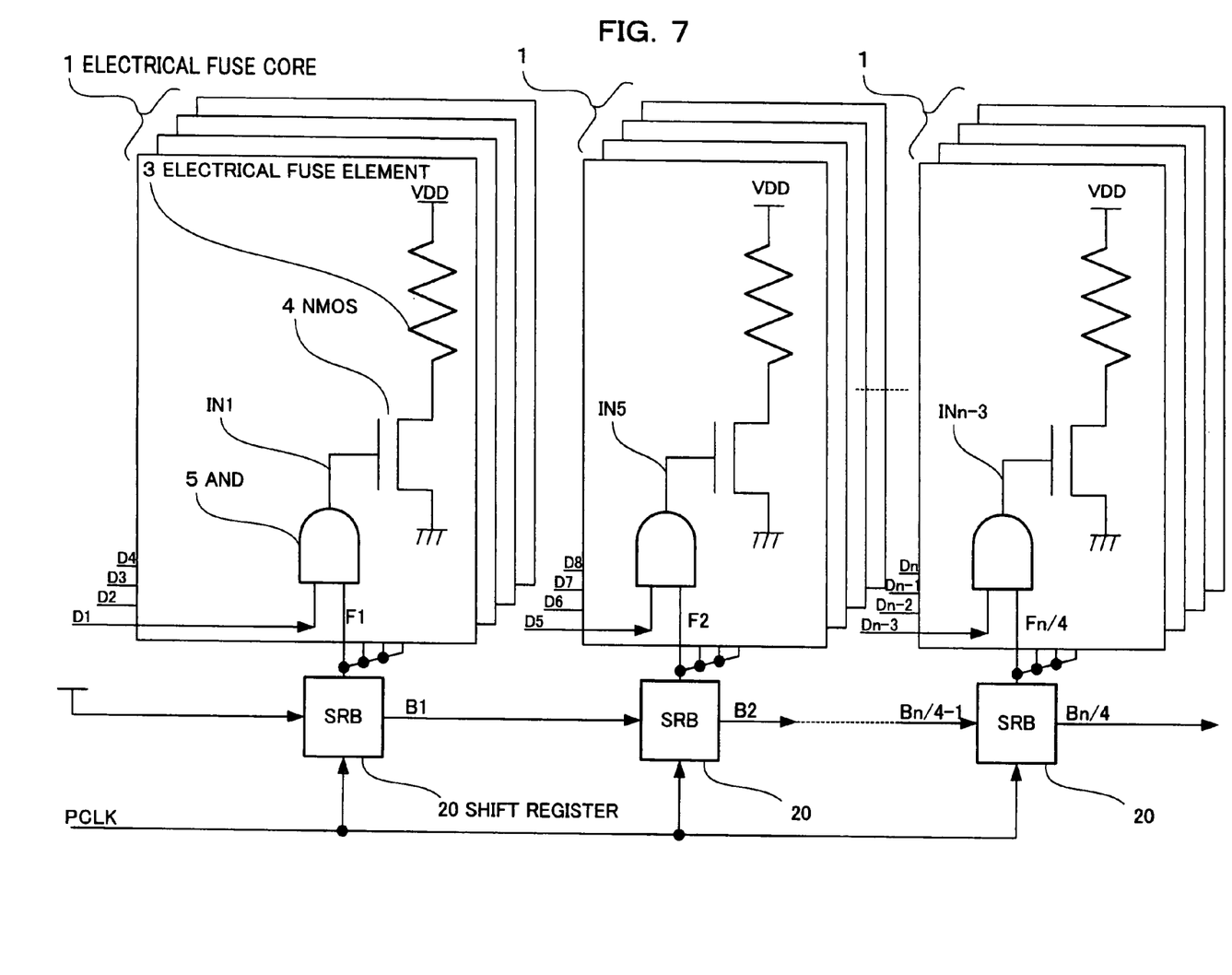
FIG. 7 is a circuit diagram showing the configuration of an electrical fuse circuit according to Embodiment 3 of the present invention.

FIG. 7 is a circuit diagram showing the configuration of the electrical fuse circuit of Embodiment 3, in which two or more (n) electrical fuse elements are configured as one module. The same constituent elements as FIG. 4 are indicated by the same reference numerals.

In FIG. 7, reference numeral 20 denotes shift registers of n/4 stages. As in FIG. 4, the input of the shift register 20 of the first stage is fixed at a power supply (H level). The shift registers 20 are serially connected from the first stage to the n/fourth stage in such a way that the output of the previous stage is connected to the input of the subsequent stage. Program enable transmission signals are represented as B1 to Bn/4. Program enable signals F1 to Fn/4 outputted from the shift register 20 are each connected to a program enable signal shared by four of n electrical fuse cores 1. Four electrical fuse cores 1 make up one block. The specific circuit configuration of the shift register 20 is identical to that of FIG. 5.

Figure 8:
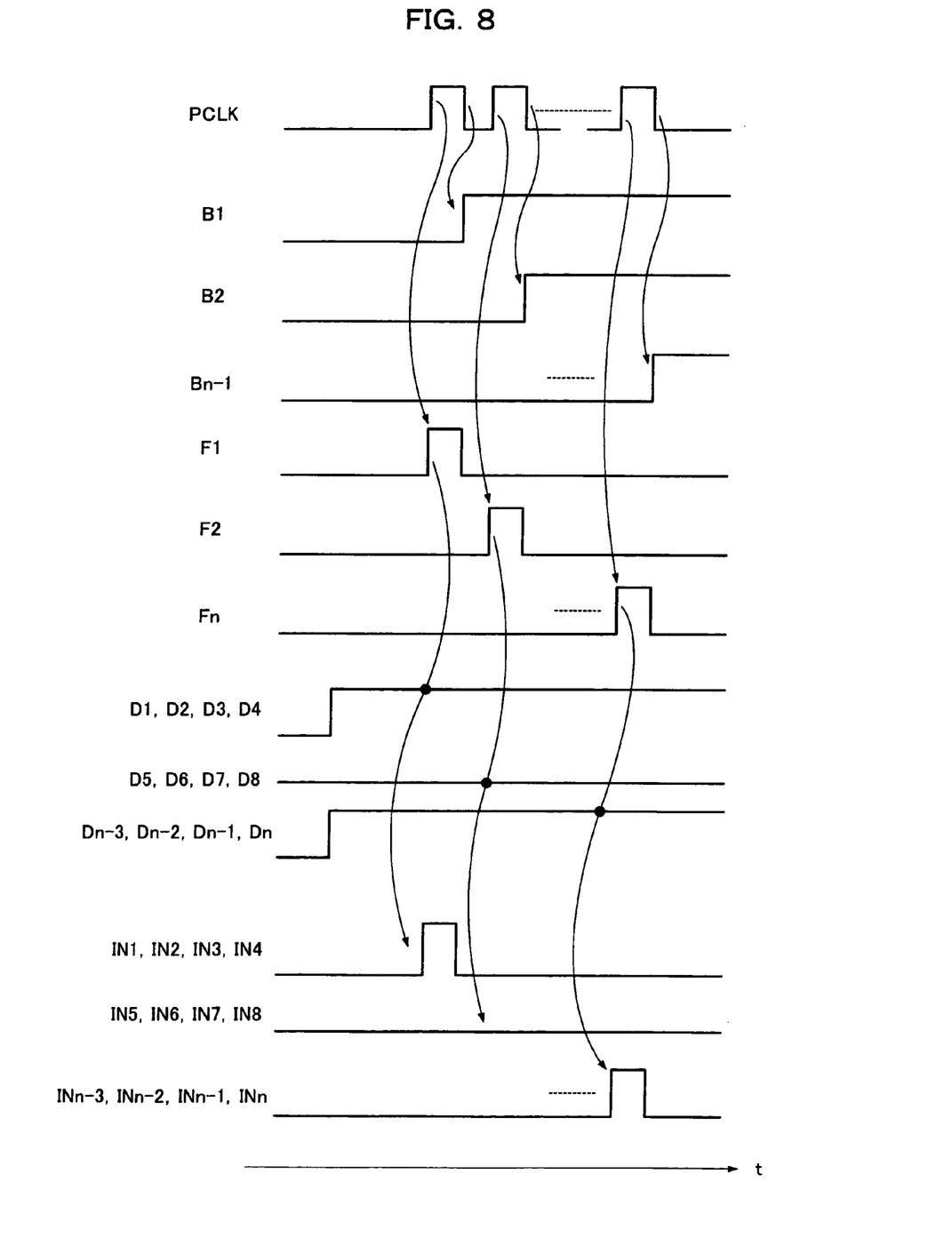
FIG. 8 is a waveform chart showing the operations of the electrical fuse circuit of Embodiment 3.

Referring to FIG. 8, the following will discuss the operations of the electrical fuse circuit configured thus.

For the sake of simplicity, the same program data Di is inputted to every four of the n electrical fuse cores 1 in such a way that one data is inputted to the first to fourth electrical fuse cores 1, no data is inputted to the fifth to eighth electrical fuse cores 1, and one data is inputted to the (n−3)th to n-th electrical fuse cores 1. The circuit operations of the shift register 20 are the same as Embodiment 2. The program enable signals Fi (i=1 to n/4), which are the output of the shift register 20, are sequentially inputted to every four of the electrical fuse cores 1 according to the period of a program clock signal PCLK.

When the pulse signal of the program enable signal Fi is inputted to a two-input AND circuit 5 of the electrical fuse core 1, a programmable state is generated as described in Embodiment 1. Thus, the state of the output INi (i=1 to n) of the two-input AND circuit 5 is determined based on program data. In FIG. 8, IN1 to IN4 are set at H, the NMOS transistor 4 is turned on only in a time period equivalent to the pulse width of IN1 to IN4, and the first to fourth electrical fuse elements 3 are blown. Further, IN5 to IN8 are set at L, the NMOS transistor 4 is turned off, and the fifth to eighth electrical fuse elements 3 are not blown. INn-3 to INn are set in a similar manner to IN1 to IN4 and the n-3 to n-th electrical fuse elements 3 are blown.

In this way, in addition to the effect of Embodiment 2, a plurality of fuses are blown at the same time. The fuses are fed with instantaneous carrying current equal to or lower than the capacity of current supplied by a tester. Thus, as compared with the electrical fuse circuit of Embodiment 2 having one shift register for one fuse core, the number of stages of the shift registers can be reduced (the number of stages of the shift registers 20 of the present embodiment is one fourth that of Embodiment 2). Therefore, it is possible to achieve an excellent electrical fuse circuit which can reduce the number of circuits and shorten time for programs.

What is claimed is:

1. An electrical fuse circuit, comprising:
a plurality of fuse cores each having a fuse element and a switch transistor connected in series with the fuse element, an end of the fuse opposite the switch transistor for receiving a fixed voltage from a voltage source, and
shift registers connected to the plurality of fuse cores for programming the fuse elements, wherein
the shift registers are for generating program enable signals, and
the plurality of fuse cores are for receiving data for programming, activating the switch transistors, and programming the fuse elements according to the program enable signals from the shift registers and data for programming.

2. An electrical fuse circuit, comprising:
a plurality of fuse cores each having a fuse element and a switch transistor connected in series with the fuse element, and
shift registers connected to the plurality of fuse cores for programming the fuse elements, wherein
the shift register of a first stage has an input fixed at H or L, and each of the shift registers comprises a DFF circuit for operating in synchronization with a program clock signal and a unit for generating a program enable signal to enable the programming in response to a change of an internal signal of the DFF circuit, the change occurring in a process where the DFF circuit sequentially transmits the input of the first stage in synchronization with the program clock signal, and
the plurality of fuse cores for sequentially activating the switch transistors for programming the fuse elements according to the program enable signals from the shift registers and data information for the programming.

3. The electrical fuse circuit according to claim 1, wherein the shift registers are for sequentially inputting the program enable signals to the plurality of fuse cores in a process of transferring the generated program enable signals, and each of the plurality of fuse cores is for activating the switch transistor in response to the input of the program enable signal.

4. The electrical fuse circuit according to claim 2, wherein the shift registers are for sequentially inputting the program enable signals to the plurality of fuse cores in a process of transferring the generated program enable signals, and each of the plurality of fuse cores is for activating the switch transistor in response to the input of the program enable signal.

5. The An electrical fuse circuit comprising:
a plurality of fuse cores each having a fuse element and a switch transistor connected in series with the fuse element, and
shift registers connected to the plurality of fuse cores for programming the fuse elements.
wherein the shift registers are for generating program enable signals, and
the plurality of fuse cores are for activating the switch transistors and programming the fuse elements according to the program enable signals from the shift registers and data information for the programming,
wherein the plurality of fuse cores are each divided into a plurality of blocks and an input of the program enable signal is shared by each of the blocks, the shift registers are for sequentially inputting the program enable signals to the plurality of blocks in a process of transferring the generated program enable signals, and the plurality of fuse cores are for activating the switch transistors in response to the input of the program enable signal to each of the blocks.

6. The electrical fuse circuit according to claim 2, wherein the plurality of fuse cores are each divided into a plurality of blocks and an input of the program enable signal is shared by each of the blocks, the shift registers are for sequentially inputting the program enable signals to the plurality of blocks in a process of transferring the generated program enable signals, and the plurality of fuse cores are for activating the switch transistors in response to the input of the program enable signal to each of the blocks.

7. The electrical fuse circuit according to claim 2, wherein the shift registers each comprise:
- a DFF circuit including a master circuit which is connected to the shift register of a previous stage for receiving a program enable signal and a slave circuit which has an input connected to; an output of the master circuit and has an output connected to the shift register of a subsequent stage for outputting the program enable signal, the DFF circuit operating in synchronization with the program clock signal; and
- a unit for generating a program enable signal of a one-shot pulse waveform in response to a change of output signals from the master circuit and the slave circuit of the DFF circuit, the change occurring in a process where the DFF circuit sequentially transmits the input of the shift register of the first stage in synchronization with the program clock signal.

8. The electrical fuse circuit according to claim 1, wherein the voltage level of the fixed voltage source is H.

* * * * *